United States Patent [19]

Mashima

[11] Patent Number: 4,745,289
[45] Date of Patent: May 17, 1988

[54] MULTIWAVELENGTH OPTICAL APPARATUS FOR LASER PROCESSING ALIGNMENT AND OBSERVATION

[75] Inventor: Kiyoto Mashima, Kawasaki, Japan

[73] Assignee: Nippon Kogaku K. K., Tokyo, Japan

[21] Appl. No.: 849,294

[22] Filed: Apr. 8, 1986

[30] Foreign Application Priority Data

Apr. 17, 1985 [JP] Japan .................................. 60-81954

[51] Int. Cl.⁴ ........................ G01N 21/86; G01V 9/04
[52] U.S. Cl. ...................................... 250/548; 250/557
[58] Field of Search ................ 250/557, 548, 201 AF; 356/400

[56] References Cited

U.S. PATENT DOCUMENTS

| 4,278,893 | 7/1981 | Kato et al. | 250/548 |
| 4,301,363 | 11/1981 | Suzuki et al. | 250/548 |
| 4,337,398 | 6/1982 | Ohnishi et al. | 250/557 |
| 4,395,117 | 7/1983 | Suzuki | 250/557 |
| 4,595,829 | 6/1986 | Neümann et al. | 250/201 |
| 4,603,976 | 8/1986 | Fetzer et al. | 250/557 |

Primary Examiner—David C. Nelms
Assistant Examiner—William L. Oen
Attorney, Agent, or Firm—Shapiro and Shapiro

[57] ABSTRACT

A multi-wavelength optical apparatus for laser processing, alignment and observation employs dichroic mirrors, which, by virtue of their wavelength characteristics, affect a processing laser beam differently from alignment and observation light. A projection optical system and a dichroic mirror form first and second images of an aperture on an object disposed on a movable stage from processing light and alignment light, respectively. The position of the second image relative to a reference is determined and automatically provides the position of the first image relative to the reference. The apparatus is used to repair microdefects in semiconductor circuit elements, for example.

14 Claims, 2 Drawing Sheets

MULTIWAVELENGTH OPTICAL APPARATUS FOR LASER PROCESSING ALIGNMENT AND OBSERVATION

BACKGROUND OF THE INVENTION

1. Field of the Invention

The present invention relates to a laser processing apparatus using a laser as a processing light source and, more particularly, to a laser processing optical apparatus suitable for repairing a circuit micropattern formed on a wafer during the fabrication of semiconductor circuit elements such as ICs and LSIs.

2. Related Background Art

Along with the rapid development of high integration semiconductor circuit elements in recent years, patterns formed on wafers have been miniaturized with higher precision. Under these circumstances, during the fabrication of semiconductor circuit elements, microdefects are often formed in their patterns. Finished semiconductor circuit elements as a whole become defective because of these microdefects and decrease the manufacturing yield. In order to increase the yield of a plurality of chips formed on a wafer during the fabrication process of semiconductor circuit elements such as ICs and LSIs, a technique is proposed to repair microdefects in a chip with a laser beam. A strong demand has arisen for an apparatus which can repair microdefects with a laser beam. When a wiring pattern in each chip on the wafer is to be repaired, the defective portion of the chip must be accurately irradiated with the laser beam, regardless of the different chip position on the wafer. However, conventional laser processing apparatuses have poor aligning precision when a chip is aligned with a predetermined radiation position. In VLSIs, for example, the line width of the circuit elements has become very small along with the development of micropatterning. A laser beam of a small spot size is required, and at the same time, the very small laser beam spot must be accurately aligned with the portion to be repaired. For this purpose, high precision position detection is essential. In addition, in order to increase the throughput of the wafer processing rate, laser power must be maximized. Thus, demand has arisen for an apparatus which satisfies the above requirements.

SUMMARY OF THE INVENTION

It is, therefore, an object of the present invention to provide a laser processing optical apparatus for effectively emitting a processing laser beam onto a surface portion of a workpiece, and for accurately detecting a laser spot position.

It is another object of the present invention to perform both laser spot projection and detection of a position to be projected with the laser spot, through a common projection objective lens.

It is still another object of the present invention to allow observation of the laser spot projected by a laser spot projection optical system and a wafer pattern projected with the laser spot through a laser spot projection objective lens.

It is still another object of the present invention to change the shape and size of the laser beam spot projected on the wafer pattern and allow observation of a changed laser spot through an observation optical system.

In order to achieve the above objects of the present invention, a light beam of a wavelength different from that of a processing laser beam is used as an aligning light beam, and a dichroic mirror is arranged in a projection optical path for projecting the processing and aligning beams passing through an aperture, and forming these beams as light spot images through an objective lens. The dichroic mirror totally reflects or transmits the processing laser beam. However, this dichroic mirror transmits the first half of rays of the aligning beam and reflects the second half thereof. The processing laser beam passing through the aperture can be projected as a light spot image on the surface of the workpiece without any substantial loss. The first half of rays of the aligning beam propagate along the same optical path as that of the processing laser beam. However, the second half thereof are separated by the dichroic mirror and can be guided along another optical path. A reflected beam from the light spot image of the aligning beam is detected through the dichroic mirror to perform alignment of the surface of the workpiece with the light spot image. At the same time, the surface of the workpiece can be irradiated with an illumination beam of a wavelength substantially the same as that of the aligning beam. Therefore, the aligning surface of the workpiece together with the aligning light spot image can be observed through the dichroic mirror.

The above and other objects, features, and advantages of the present invention will be apparent from the following detailed description of preferred embodiments in conjunction with the accompanying drawings.

DESCRIPTION OF THE PREFERRED EMBODIMENTS

Figure 1:
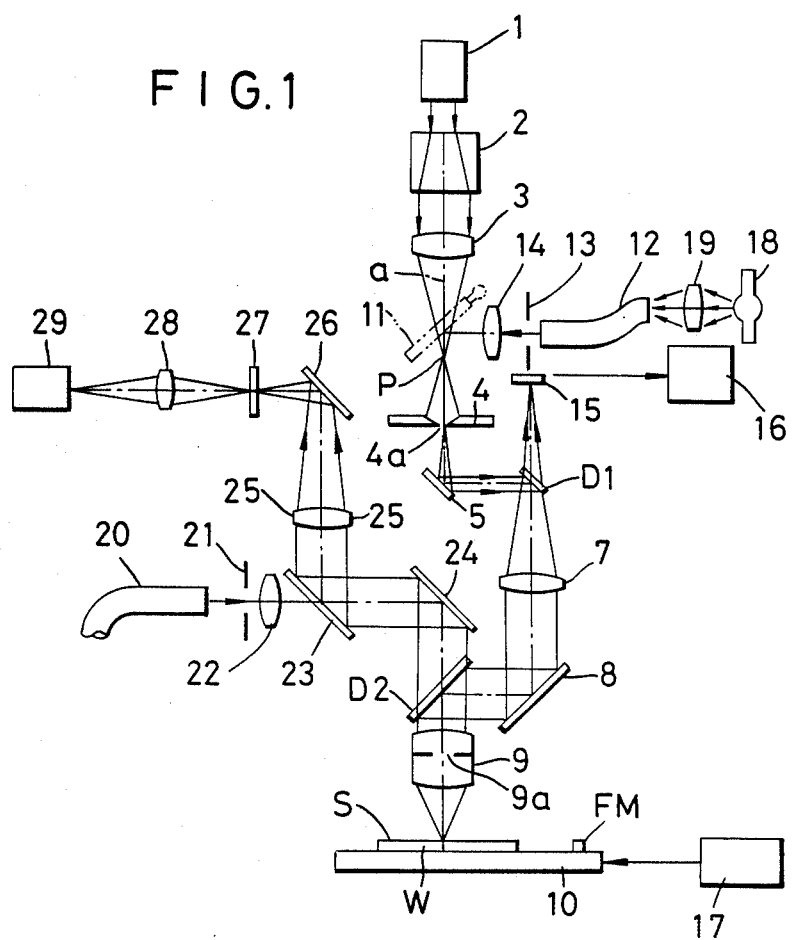
FIG. 1 is a schematic view showing the system configuration of a laser processing optical apparatus according to an embodiment of the present invention.

FIG. 1 shows an optical system according to a preferred embodiment of the present invention. A laser beam from a laser source 1 is expanded by a beam expander 2 to a beam of a predetermined width. The beam of the predetermined width is focused by a focusing lens 3 to its rear focal position P. An aperture member 4 is arranged in a defocusing position away from the focal position P along an optical axis a. The aperture member 4 has a rectangular opening 4a, shown in the plan view of FIG. 2. The opening 4a is illuminated with the beam from the laser source 1. The beam output from the opening 4a is reflected by an optical path changing reflecting mirror 5 and a first dichroic mirror D1 (to be described later). The reflected beam is collimated by a collimator lens 7, and the collimated beam is reflected by an optical path changing reflecting mirror 8 and a second dichroic mirror D2. This reflected beam passes through an objective lens 9 and is focused on a surface S of a workpiece such as a wafer W. The opening 4a of the aperture member 4 and the workpiece surface S are conjugate with projection lenses constituted by the collimator and objective lenses 7 and 9. The laser source 1 can be exemplified by a YAG laser, and a laser beam of a wavelength $\eta1=532$ nm as a second-order harmonic is preferably used.

Figure 2:
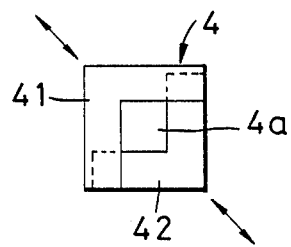
FIG. 2 is a plan view of an aperture member in the apparatus of FIG. 1.

The size of the aperture 4a of the aperture member 4 can be changed to obtain a rectangular opening of any size upon relative movement between two L-shaped light-shielding members 41 and 42 constituting the aperture member 4 (FIG. 2). Thus, the shape and size of the laser spot on the workpiece surface S can be changed in accordance with a change in the rectangular opening 4a of the aperture member 4. In this manner, a desired size and shape of the laser beam spot can be obtained to correspond with a pattern to be processed. When the size of the opening 4a of the aperture member 4 is to be changed, the focusing lens 3 may be moved along the optical axis a to supply the laser beam of a sufficient power from the laser source 1.

A focusing position detection optical system is arranged to detect the image position of the opening 4a of the aperture member 4, i.e., the laser spot position formed on the workpiece surface S with respect to the apparatus housing. An observation optical system (to be described in detail later) is arranged to allow observation of the laser spot position on the workpiece surface S.

The focusing position detection optical system will be described first. A beam from a focusing position detection light source 18 is focused by a focusing lens 19 on an incident end of an optical fiber 12. The focusing position detection light beam is output from the optical fiber 12 through a reflecting member 11. The reflecting member 11 can be obliquely inserted in or removed from an optical path between the aperture member 4 and the focusing lens 3 at the side of the processing laser source. A circular aperture 13 is arranged at an exit end of the optical fiber 12. An image of the circular aperture 13 is projected by a condenser lens 14 so as to irradiate the rectangular opening 4a of the aperture member 4, allowing it to be entirely illuminated with a focusing position detecting illumination beam. The focusing position detecting illumination beam supplied to the aperture member 4 is a beam of a wavelength $\eta2=577$ nm from, e.g., a mercury lamp 18. This beam has a wavelength similar to that ($\eta1-532$ nm) of the processing laser beam. If chromatic aberrations of the projection lenses 7 and 9 with respect to these beams are corrected, the image of the opening 4a of the aperture member 4 can be formed on the wafer W as the workpiece surface by the projection lenses 7 and 9 irradiated with the focusing position detection illumination beam.

The position of a pattern repairing point on the wafer W is measured in advance with reference to a fiducial mark FM (FIG. 1). Automatic alignment for repair is performed as follows. A stage 10 is moved to align the fiducial mark FM with the laser spot, and is then two-dimensionally moved by a premeasured distance (in X and Y directions). The pattern repairing point is thereby aligned with the laser spot. The focusing position detection optical system is used to set the laser spot position at the reference position with respect to the stage on which the wafer W as the workpiece is placed. The reflecting member 11 is inserted in the optical path, so that the illumination beam from the optical fiber 12 is reflected by the first and second dichroic mirrors D1 and D2, and is incident on the wafer surface. The stage 10 is moved by a drive circuit means 17 to align the fiducial mark FM with the image position of the opening 4a of the aperture member 4 by means of the objective lens 9, and a strong beam reflected by the fiducial mark FM returns through the projection lenses 7 and 9 and is incident on a light-receiving member 15 through the first dichroic mirror D1. An output signal photoelectrically converted by the light-receiving element 15 is supplied to a detector 16, which includes an amplifier and an A/D converter. The detector 16 detects a maximum output from the light-receiving element 15. Upon detection of the maximum output, the opening image position, i.e., the beam spot position, can be automatically detected.

Figure 3:
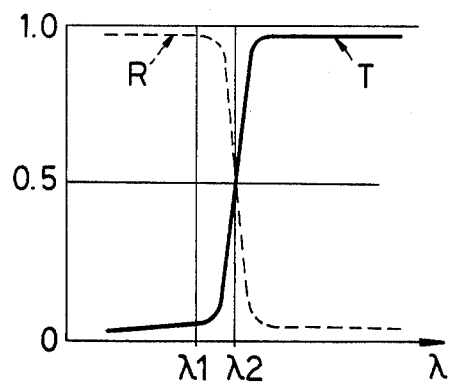
FIG. 3 is a graph showing the wavelength characteristics of a dichroic mirror of the apparatus in FIG. 1.

The wavelength characteristics of the first dichroic mirror D1 will be described with reference to FIG. 3. A broken line R in FIG. 3 represents reflectivity, and a solid line T represents transmittance. As is apparent from FIG. 3, the first dichroic mirror D1 serves as a reflecting mirror for substantially completely reflecting the processing laser beam of the wavelength $\eta1=532$ nm. However, the first dichroic mirror D1 serves as a substantially semitransmitting mirror having a 50% transmittance T and a 50% reflectivity R for the beam of the wavelength $\eta2=577$ nm, projected from the focusing position detection light source 18 through the optical fiber 12. For this reason, the processing laser beam is substantially not subjected to power loss, and is incident on the surface of the wafer W through the first dichroic mirror D1. The focusing position detection beam is reflected through the first dichroic mirror D1 along the forward optical path and forms a spot image of the opening 4a through the objective lens 9. However, the focusing position detection beam is transmitted through the objective lens 9 and the first dichroic mirror D1, and is incident on the light-receiving element 15 in the backward optical path. In this manner, the focusing position can be accurately detected by a so-called TTL. A difference between the wavelength $\eta1$ of the processing laser beam and the wavelength $\eta2$ of the focusing position detection beam can be greater than that described above to achieve position detection with high precision. However, when the wavelength of the light beam from the focusing position detection light source is almost the same as that of the processing laser beam, chromatic aberrations of the projection lenses can be properly corrected for these wavelengths.

It should be noted that the dichroic mirror D1 can be prepared by alternately forming a high refractive index $TiO_2$ layer and a low refractive index $SiO_2$ layer on a glass plate.

The observation optical system for observing a beam spot position on the wafer surface will now be described. The observation optical system is operated in the same manner as the focusing position detection optical system. That is, coaxial forward illumination through the objective lens 9 is performed. An observation illumination beam from an optical fiber 20 is transmitted through a condenser lens 22 and a semitransmitting mirror 23 and is reflected by an optical path changing reflecting mirror 24. The reflected beam passes through the second dichroic mirror D2 and is guided to the lens 9. The exit end of the optical fiber 20 is projected by the condenser lens 22 on an incident pupil 9a of the objective lens 9, and Köhler's illumination is performed. An image of a circular aperture 21 arranged between the condenser lens 22 and the exit end of the optical fiber 20 is projected by the condenser lens 22 and the objective lens 9 onto the wafer surface S as the object surface. The circular aperture 21 thus serves as a field aperture. The beam reflected by the wafer surface S passes through the objective lens 9 and the second dichroic mirror D2, and returns to the semitransmitting mirror 23. The observation beam reflected by the semitransmitting mirror 23 is then focused on a focal point mirror 27 through a focusing lens 25 and an optical path changing reflecting mirror 26. The pattern image of the wafer W is thus formed on the focal plane. A reference mark such as a cross is formed on the focal point mirror 27. The images of the reference mark and the wafer are focused on an image pickup device 29 such as an ITV through a relay lens 28. Observation of the image on the image pickup device 29 allows observation of a region including the laser spot radiation position on the wafer surface S.

The illumination source of the observation optical system can also serve as that of the focusing position detection optical system, and the beam from the mercury lamp 18 can be guided by the optical fiber 20. In this case, the characteristics of the second dichroic mirror D2 are set to be the same as those (FIG. 3) of the first dichroic mirror D1. The second dichroic mirror D2 achieves substantially total reflection of the processing laser beam. However, the second dichroic mirror D2 also serves as a semitransmitting mirror for the observation beam. The beam guided by the optical fiber 20 to the observation optical system has substantially the same wavelength as the wavelength η2. However, a light source for the observation optical system may comprise another light source in place of the light source 18. With the observation optical system, upon radiation of the focusing position detecting beam, the spot image of the aperture opening 4a and the wide pattern image on the wafer can be simultaneously observed. In addition, upon switching of the reflecting member 11, the wafer surface S can be observed during processing with the processing laser beam to check if accurate processing is performed for the desired pattern. Furthermore, by changing the opening 4a of the aperture member 4, the size and shape of the spot can be changed. Upon movement of the stage 10, the spot position on the wafer surface can be adjusted.

In the above embodiment, the wavelength characteristics of the two dichroic mirrors D1 and D2, among the optical elements 2 to 9 in the laser spot projection optical system for laser processing, are arranged to combine the optical elements 12 to 15 of the focusing position detection illumination optical system and the optical elements 20 to 29 of the observation optical system. Therefore, accurate spot detection and observation can be performed while the intensity of the processing laser is maximized. The circuit elements on the wafer W can be repaired (cut and annealed) with the YAG laser beam, and the size and shape of the laser spot can be changed as needed. In addition, the laser spot position can be automatically detected, and the repairing position can be observed.

In the above embodiment, the first and second dichroic mirrors D1 and D2 achieve total reflection of the processing laser beam and serve as semitransmitting mirrors for the beams of the focusing position and observation optical systems. However, the dichroic mirrors are not limited to this arrangement. The beams of the laser spot projection optical system can be substantially completely transmitted in accordance with a proper combination of their wavelength ranges and the characteristics of the dichroic mirrors.

Figure 4:
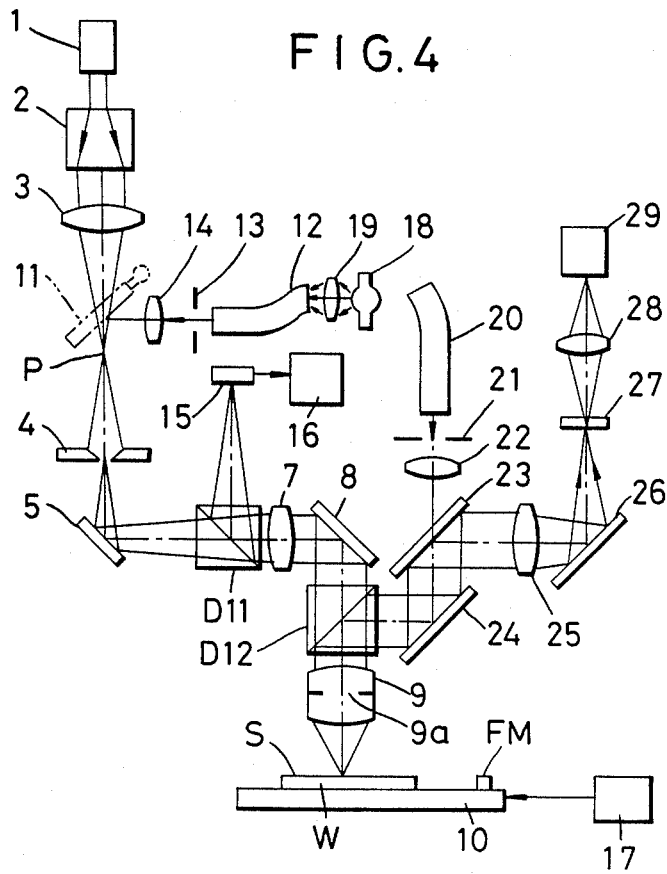
FIG. 4 is a schematic view showing the system configuration of a laser processing optical apparatus according to another embodiment of the present invention.

FIG. 4 shows a schematic system configuration of a laser processing optical apparatus according to another embodiment of the present invention. In this apparatus, first and second dichroic mirrors D11 and D12 achieve substantially total transmission of a beam from a laser spot projection optical system and serve as semitransmitting mirrors for beams from focusing position detection and observation optical systems. The first and second dichroic mirrors D11 and D12 have the same arrangement as those of the embodiment of FIG. 1, except that two prisms are adhered to constitute each dichroic mirror, instead of two parallel plates. The same reference numerals in FIG. 4 denote the same parts as in FIG. 1, and a detailed description thereof will be omitted. In the embodiment of FIG. 4, a processing beam from the laser spot projection optical system can be incident on a wafer surface S with high efficiency. In addition, the laser spot position can be accurately detected.

In the above two embodiments, the dichroic mirrors D1 and D2 and the dichroic mirrors D11 and D12 have the same function. One (e.g., D1) of the dichroic mirrors may be arranged to substantially entirely transmit the laser spot beam, as does D11 of FIG. 4, and the other (e.g., D2) may substantially entirely reflect the laser spot beam, as shown in FIG. 1, and vice versa. In the above embodiment, the focusing position detecting light source is exemplified by a mercury lamp which emits a beam through the optical fiber 12. However, the mercury lamp may be replaced with a laser source. In addition, if automatic control is not required, the light-receiving element 15 and the detector 16 can be omitted. In this case, the dichroic mirror D1 of FIG. 1 is replaced with a normal reflecting mirror, and the dichroic mirror D11 in FIG. 4 is omitted.

What I claim is:
1. An apparatus for processing an object including:
(a) first generating means for generating a first light beam to process the object;
(b) second generating means for generating a second light beam of a wavelength different from that of said first light beam;
(c) aperture means having an aperture irradiated with the first and second light beams;
(d) stage means for disposing said object thereon;
(e) dichroic mirror means for substantially entirely reflecting or transmitting said first light beam and for partially reflecting and partially transmitting said second light beam;
(f) a projection optical system having an objective lens, said dichroic mirror means being disposed between said aperture means and said objective lens, said dichroic mirror means and said projection optical system causing an object disposed on said stage means and said aperture means to be conjugate with each other and forming a first image of said aperture conforming to said first light beam and a second image of said aperture conforming to said second light beam on the object disposed on said stage means;
(g) means for providing relative displacement between said projection optical system and said stage means along two dimensional coordinates substantially perpendicular to an optical axis of said objective lens; and
(h) determining means for detecting a position of said second image with respect to said two dimensional coordinates, whereby a position of said first image with respect to said two dimensional coordinates may be determined from said detected position of said second image.

2. An apparatus according to claim 1, wherein said determining means has a predetermined mark disposed on said stage means and photoelectric converting means arranged outside an optical path from said objective lens to said aperture means for receiving, through said objective lens and said dichroic mirror means, light of said second light beam reflected by said predetermined mark.

3. An apparatus according to claim 2, wherein the wavelength of said second light beam is selected so that an aberration of said second light beam by said projection optical system is substantially equal to an aberration of said first light beam by said projection optical system.

4. An apparatus according to claim 3, which further comprises guiding means for guiding said first and second light beams selectively to said aperture means.

5. An apparatus according to claim 4, wherein said guiding means has a reflecting member for insertion in or removal from an optical path between said first generating means and said aperture means, said first light beam irradiates said aperture means when said reflecting member is removed from the optical path between said first generating means and said aperture means, and said second light beam irradiates said aperture means when said reflecting member is inserted in the optical path between said first generating means and said aperture means.

6. An apparatus according to claim 2, wherein said determining means has photoelectric converting means arranged outside an optical path from said objective lens to said aperture measn for receiving said second light beam through said objective lens and said dichroic mirror means.

7. An apparatus according to claim 1, wherein the first light beam is a laser beam generated by a YAG laser and has a wavelength $\eta 1$ of 532 nm, the second light beam is a beam generated by a mercury lamp and has a wavelength $\eta 2$ of 577 nm, and chromatic aberrations of said objective lens are corrected for the wavelengths $\eta 1$ and $\eta 2$.

8. An apparatus according to claim 1, wherein said projection optical system includes a collimator lens arranged on a projection optical path between said aperture and said objective lens, and said dichroic mirror means is arranged on a projection optical path between said collimator lens and said aperture.

9. An apparatus according to claim 8, wherein said projection optical system includes another dichroic mirror means arranged on the optical path between said collimator lens and said objective lens and has the same function as that of said dichroic mirror means, and the image of said aperture irradiated with the second light beam is adpated to be observable through said another dichroic mirror means.

10. An apparatus according to claim 1, wherein said projection optical means has a focusing lens for focusing the first light beam at a predetermined position, and said aperture means is located away from the predetermined position along a direction of an optical axis of said focusing lens.

11. An apparatus for processing an object including:
(a) means for generating a first light beam to process the object;
(b) means for generating a second light beam of a wavelength different from that of said first light beam;
(c) aperture means having an aperture irradiated with the first and second light beams;
(d) stage means for disposing said object thereon;
(e) dichroic mirror means for substantially entirely reflecting or transmitting said first light beam and for partially reflecting and partially transmitting said second light beam;
(f) a projection optical system having an objective lens, said dichroic mirror means being disposed between said aperture means and said objective lens, said dichroic mirror means and said projection optical system causing an object disposed on said stage means and said aperture means to be conjugate with each other and forming a first image of said aperture conforming to said first light beam and a second image of said aperture conforming to said second light beam on the object disposed on said stage means;
(g) means for providing relative displacement between said projection optical system and said stage means along two dimensional coordinates substantially perpendicular to an optical axis of said objective lens; and
(h) determining means for detecting a position of said second image with respect to said two dimensional coordinates and thereby determining a position of said first image with respect to said two dimensional coordinates on the basis of said detected position of said second image.

12. An apparatus according to claim 11, wherein said determining means has a predetermined mark disposed on said stage means and photoelectric converting means arranged outside an optical path from said objective lens to said aperture means for receiving, through said objective lens and said dichroic mirror means, light of said second light beam reflected by said predetermined mark.

13. An apparatus according to claim 12, wherein said deterimining means determines said position of said second image when said photoelectric converting means receives the light of said second light beam reflected by said predetermined mark.

14. An apparatus for processing an object including:
(a) means for generating a first light beam to process the object;
(b) means for generating a second light beam of a wavelength different from that of said first light beam;
(c) aperture means having an aperture irradiated with said first and second light beams;
(d) stage means for disposing the object thereon;
(e) dichroic mirror means for substantially entirely reflecting or transmitting said first light beam and for partially reflecting and partially transmitting said second light beam;
(f) a projection optical system having an objective lens, said dichroic mirror means being disposed between said aperture means and said objective lens, said dichroic mirror means and said projection optical system causing an object disposed on said stage means and said aperture means to be conjugate with each other and forming a first image of said aperture conforming to said first light beam and a second image of said aperture conforming to said second light beam on the object disposed on said stage means;

(g) means for providing relative displacement between said projection optical system and said stage along two dimensional coordinates substantially perpendicular to an optical axis of said objective lens; and (h) determining means having photoelectric converting means arranged outside an optical path from said objective lens to said aperture means, said photoelectric converting means receiving light through said projection optical system and said dichroic mirror means conforming to said second light beam and for producing a signal comforming to said received light, said determining means detecting a position of said second image with respect to said two dimensional coordinates on the basis of said signal, whereby a position of said first image with respect to said two dimensional corrdinates is determined as said detected position of said second image.

* * * * *